(12) United States Patent
Tsujimoto et al.

(10) Patent No.: US 9,017,807 B2
(45) Date of Patent: Apr. 28, 2015

(54) TRANSPARENT CONDUCTIVE FILM, SUBSTRATE WITH TRANSPARENT CONDUCTIVE FILM, AND ORGANIC ELECTROLUMINESCENCE ELEMENT USING THE SAME

(75) Inventors: Akira Tsujimoto, Nara (JP); Taisuke Matsui, Osaka (JP); Hiroshi Yokogawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 99 days.

(21) Appl. No.: 13/812,013

(22) PCT Filed: Feb. 7, 2012

(86) PCT No.: PCT/JP2012/052695
§ 371 (c)(1),
(2), (4) Date: Jan. 24, 2013

(87) PCT Pub. No.: WO2012/120949
PCT Pub. Date: Sep. 13, 2012

(65) Prior Publication Data
US 2013/0122279 A1 May 16, 2013

(30) Foreign Application Priority Data
Mar. 10, 2011 (JP) ................ 2011-053424

(51) Int. Cl.
*B32B 5/22* (2006.01)
*H01B 1/12* (2006.01)
(Continued)

(52) U.S. Cl.
CPC ............ *H01B 1/124* (2013.01); *Y10T 428/265* (2015.01); *B32B 27/08* (2013.01); *B32B 27/20* (2013.01);
(Continued)

(58) Field of Classification Search
USPC .......................... 428/411.1, 315.7
See application file for complete search history.

(56) References Cited

U.S. PATENT DOCUMENTS

| 7,582,351 B2 | 9/2009 | Yokogawa et al. |
| 2008/0152870 A1 | 6/2008 | Takada et al. |

(Continued)

FOREIGN PATENT DOCUMENTS

| JP | 2009-070660 | 4/2009 |
| JP | 2011-029036 | 2/2011 |

(Continued)

OTHER PUBLICATIONS

Jiu et al., "Preparation of Ag nanorods with high yield by polyol process", Materials Chemistry and Physics, vol. 114, 2009, pp. 333-338.

(Continued)

*Primary Examiner* — Hai Vo
(74) *Attorney, Agent, or Firm* — Greenblum & Bernstein, P.L.C.

(57) ABSTRACT

A transparent conductive film includes a first transparent resin layer including a plurality of thin metallic wires, a second transparent resin layer containing a conductive polymer, and a third transparent resin layer provided between the first transparent resin layer and the second transparent resin layer. The second transparent resin layer contains a resin which is soluble in water, and the third transparent resin layer contains a resin which is insoluble in water or has water resistance. The third transparent resin layer can suppress mixing of the second transparent resin layer with the first transparent resin layer and can make the second transparent resin layer less likely to be damaged by the first transparent resin layer. Therefore, a surface of the second transparent resin layer is made smooth and electrical conductivity is made uniform.

7 Claims, 2 Drawing Sheets

2: SUBSTRATE
3: TRANSPARENT CONDUCTIVE FILM
7: THIN METALLIC WIRE
8: FIRST TRANSPARENT RESIN LAYER
9: SECOND TRANSPARENT RESIN LAYER
10: THIRD TRANSPARENT RESIN LAYER (51) Int. Cl.
  *B32B 27/08*    (2006.01)
  *B32B 27/20*    (2006.01)
  *B32B 3/26*     (2006.01)
  *H01B 1/20*     (2006.01)
  *H01B 1/22*     (2006.01)
  *H01L 51/52*    (2006.01)
  *H01L 51/00*    (2006.01)

(52) U.S. Cl.
  CPC ..... *B32B 2262/103* (2013.01); *B32B 2262/106* (2013.01); *B32B 2307/412* (2013.01); *B32B 3/26* (2013.01); *B32B 2457/20* (2013.01); *B32B 2307/202* (2013.01); *H01B 1/20* (2013.01); *H01B 1/22* (2013.01); *H01L 51/5215* (2013.01); *H01L 51/003* (2013.01)

(56) References Cited

U.S. PATENT DOCUMENTS

2010/0255323 A1  10/2010  Nakamura et al.
2011/0018424 A1   1/2011  Takada
2012/0119643 A1   5/2012  Yamamoto

FOREIGN PATENT DOCUMENTS

WO     2007/022226         2/2007
WO  WO 2010010838 A1 *    1/2010

OTHER PUBLICATIONS

Search report from International Application No. PCT/JP2012/052695, mail date is May 1, 2012.

* cited by examiner

FIG. 1

2: SUBSTRATE
3: TRANSPARENT CONDUCTIVE FILM
4: ORGANIC LIGHT EMITTING LAYER
5: CONDUCTOR LAYER
6: TRANSPARENT CONDUCTIVE FILM-ATTACHED SUBSTRATE

FIG. 2

2: SUBSTRATE
3: TRANSPARENT CONDUCTIVE FILM
7: THIN METALLIC WIRE
8: FIRST TRANSPARENT RESIN LAYER
9: SECOND TRANSPARENT RESIN LAYER
10: THIRD TRANSPARENT RESIN LAYER

FIG. 3

PRIOR ART

TRANSPARENT CONDUCTIVE FILM, SUBSTRATE WITH TRANSPARENT CONDUCTIVE FILM, AND ORGANIC ELECTROLUMINESCENCE ELEMENT USING THE SAME

TECHNICAL FIELD

The present invention relates to a transparent conductive film for use in various optical devices, a substrate with the transparent conductive film, and an organic electroluminescence element using the same.

BACKGROUND ART

In a general organic electroluminescence (hereinafter, referred to as organic EL) element, an organic light emitting layer is formed on a transparent substrate so as to be interposed between a pair of electrodes, and light from the organic light emitting layer passes through one of the electrodes and is extracted from the substrate side. In such an organic EL element, as the material of the electrode on the substrate side, a material having electrical conductivity and translucency is used, and indium tin oxide (hereinafter, referred to as ITO) is widely used. However, an electrode for which ITO is used as the material is fragile and is easy to break with respect to bending or physical stress. In addition, in order to improve the electrical conductivity of the electrode for which ITO is used, a high deposition temperature and/or a high anneal temperature are needed, and thus there is a concern over increased costs in the manufacturing of a device using an organic EL element.

Thus, a technology of using a transparent conductive film including a plurality of thin metallic wires as an electrode instead of ITO is known (e.g., see Japanese Laid-Open Patent Publication No. 2009-505358). A configuration example of a substrate with such a transparent conductive film will be described with reference to FIG. 3. A transparent conductive film-attached substrate 101 includes a substrate 102 having transparency and a transparent conductive film 103 formed on the substrate 102. The transparent conductive film 103 includes a plurality of thin metallic wires 104 in the form of thin wires, a first transparent resin layer 105 as a binder, and a second transparent resin layer 106 covering the first transparent resin layer 105. The plurality of thin metallic wires 104 are adhered on the substrate 102 by the first transparent resin layer 105. In addition, the plurality of thin metallic wires 104 protrude from a surface of the first transparent resin layer 105 which surface is opposite to a surface facing the substrate 102. Thus, the surface is rugged and has poor smoothness. Therefore, in order to improve the smoothness of the surface, the second transparent resin layer 106 is formed on the first transparent resin layer 105.

Figure 3:
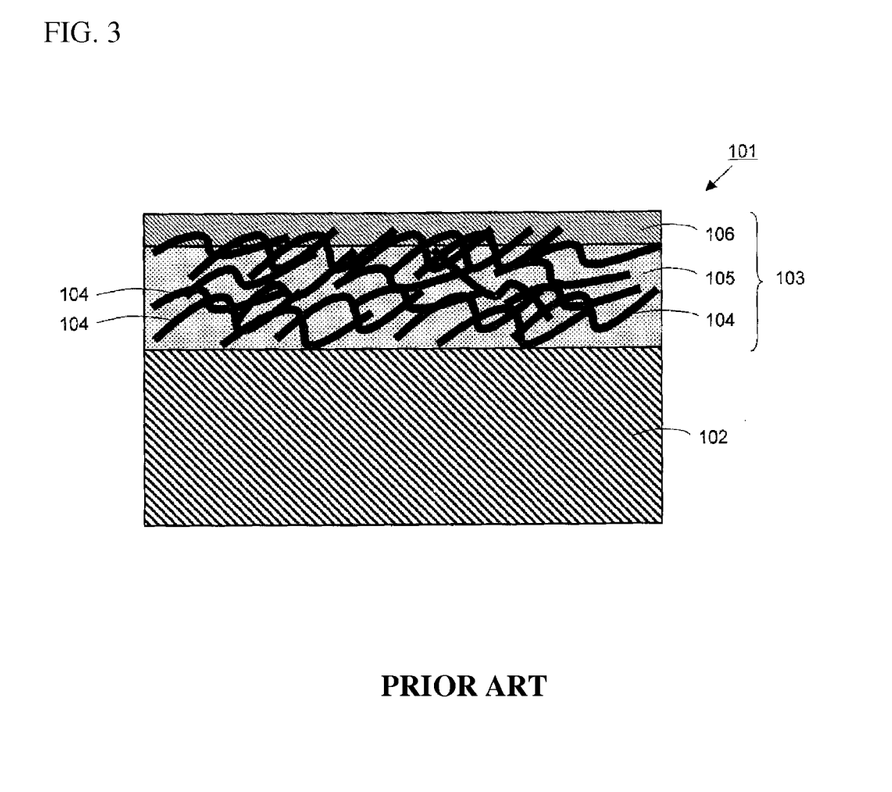
FIG. 3 is a cross-sectional view of a conventional substrate with a transparent conductive film.

However, in the case where the second transparent resin layer 106 is applied onto the first transparent resin layer 105 in an overlapping manner, the first transparent resin layer 105 and the second transparent resin layer 106 may be mixed. In addition, the second transparent resin layer 106 may be damaged by the rugged first transparent resin layer 105. When the material of each transparent resin layer is mixed or one of the layers is damaged as described above, there is the possibility that electrical conductivity is decreased or made ununiform. Furthermore, the second transparent resin layer 106 cannot be uniformly applied onto the first transparent resin layer 105, and there is the possibility that the electrical conductivity is made ununiform on the surface of the transparent conductive film 103.

DISCLOSURE OF THE INVENTION

The present invention solves the above problem, and an object of the present invention is to provide: a transparent conductive film which includes a transparent resin layer including a thin metallic wire and a transparent resin layer smoothing the transparent resin layer, which suppresses mixture of these transparent resin layers, in which one of the transparent resin layers is less likely to be damaged by the other transparent resin layer, and which has a smooth surface and uniform electrical conductivity; a substrate with the transparent conductive film; and an organic electroluminescence element using the same.

A transparent conductive film according to the present invention includes: a first transparent resin layer including a thin metallic wire; a second transparent resin layer including a conductive polymer; and a third transparent resin layer provided between the first transparent resin layer and the second transparent resin layer. At least one of the first transparent resin layer and the second transparent resin layer comprises a resin which is soluble in water, and the third transparent resin layer comprises a resin which is insoluble in water or has water resistance.

In the transparent conductive film, the thin metallic wire is preferably a metallic nanowire or a carbon nanotube.

In the transparent conductive film, preferably, the third transparent resin layer is formed as a porous layer, and a pore diameter of the third transparent resin layer is not less than 0.5 nm and not greater than 1 μm.

In the transparent conductive film, a film thickness of the porous layer is preferably not less than 5 nm and not greater than 1 μm.

In the transparent conductive film, a contact angle with respect to water on a surface of the third transparent resin layer is preferably not greater than 75°.

In the transparent conductive film, the third transparent resin layer preferably includes a binder composed of a silicone resin.

The transparent conductive film is preferably formed on a substrate to constitute a transparent conductive film-attached substrate.

The transparent conductive film-attached substrate is preferably used in an organic electroluminescence element.

According to the transparent conductive film according to the present invention, since the third transparent resin layer including the resin which is insoluble in water or has water resistance is provided between the first transparent resin layer and the second transparent resin layer, when the first transparent resin layer and the second transparent resin layer are formed, mixing of one of these layers with the other layer can be suppressed. In addition, since the first transparent resin layer and the second transparent resin layer are not mixed, one of these layers can be less likely to be damaged by the other. Therefore, a transparent conductive film is obtained which has a smooth surface and uniform electrical conductivity.

DESCRIPTION OF THE PREFERRED EMBODIMENTS

Figure 1:
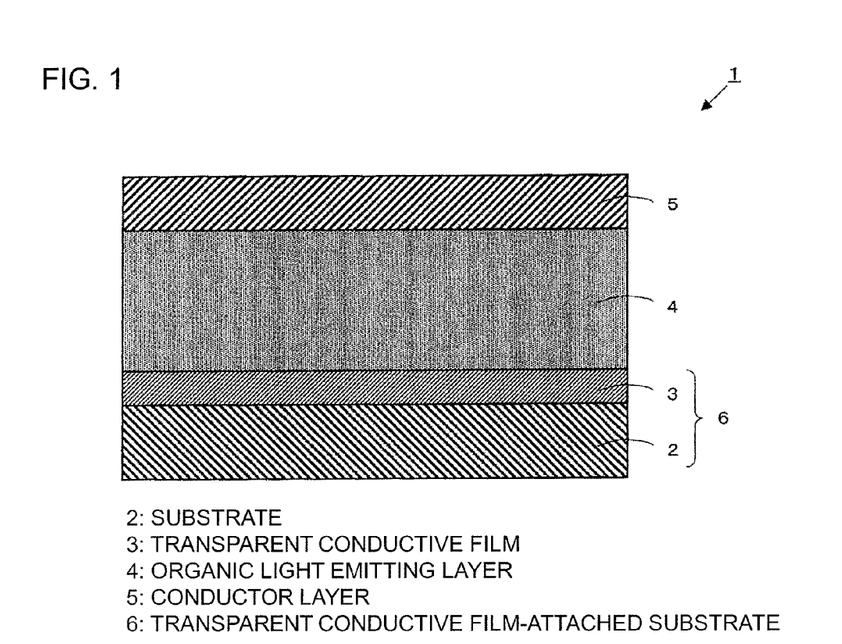
FIG. 1 is a cross-sectional configuration diagram of an example of an organic electroluminescence element including a substrate with a transparent conductive film according to an embodiment of the present invention.

Hereinafter, a transparent conductive film according to an embodiment of the present invention will be described with reference to the drawings. The transparent conductive film according to the present embodiment is formed on a substrate having translucency to constitute a transparent conductive film-attached substrate, and is used, for example, in an organic electroluminescence (hereinafter, referred to as organic EL) element. FIG. 1 shows a cross-sectional configuration of the organic EL element. The organic EL element 1 includes a substrate 2, a transparent conductive film 3, an organic light emitting layer 4, and a conductor layer 5, and has a configuration in which the transparent conductive film 3, the organic light emitting layer 4, and the conductor layer 5 are laminated on the substrate 2 in order. The substrate 2 and the transparent conductive film 3 constitute a transparent conductive film-attached substrate 6. The transparent conductive film 3 serves as an anode of the organic EL element 1 to inject positive holes (holes) to the organic light emitting layer 4. Meanwhile, the conductor layer 5 serves as a cathode of the organic EL element 1 to inject electrons to the organic light emitting layer 4.

It is preferred that a hole injection layer which prompts injection of positive holes from the transparent conductive film 3 is provided between the transparent conductive film 3 and the organic light emitting layer 4, and it is preferred that an electron injection layer which prompts injection of electrons from the conductor layer 5 is provided between the conductor layer 5 and the organic light emitting layer 4. In addition, a hole transport layer which efficiently transports positive holes and an electron transport layer which efficiently transports electrons may be provided.

In the organic EL element 1 configured as described above, when a voltage is applied between the transparent conductive film 3 and the conductor layer 5 with the transparent conductive film 3 side being set at + potential, positive holes are injected from the transparent conductive film 3 to the organic light emitting layer 4, and electrons are injected from the conductor layer 5 to the organic light emitting layer 4. Then, the positive holes and the electrons injected to the organic light emitting layer 4 are recombined within the organic light emitting layer 4, whereby the organic light emitting layer 4 emits light. The light emitted from the organic light emitting layer 4 passes through the transparent conductive film-attached substrate 6 (the transparent conductive film 3 and the substrate 2) and is extracted to the outside of the organic EL element 1. It is noted that the light applied to the conductor layer 5 is reflected by the surface of the conductor layer 5, passes through the transparent conductive film-attached substrate 6, and is extracted to the outside of the organic EL element 1.

It is noted that the material of the substrate 2 is not particularly limited as long as it is a transparent material having translucency. As such a substrate 2, for example, a rigid transparent glass plate such as soda glass or alkali-free glass, a flexible transparent plastic plate such as polycarbonate or ethylene terephthalate, or the like is used. In the case where the rigid transparent glass plate is used as the substrate 2, a device using the substrate 2 has excellent strength and the transparent conductive film 3 can easily be formed onto the substrate 2. In the case where the flexible transparent plastic plate is used as the substrate 2, a device using the substrate 2 can be reduced in weight and can be made as a device having flexibility.

In addition, as the material of the organic light emitting layer 4, anthracene, naphthalene, pyrene, tetracene, coronene, perylene, phthaloperylene, naphthaloperylene, diphenylbutadiene, tetraphenylbutadiene, coumarin, oxadiazole, bisbenzoxazorine, bisstyryl, cyclopentadiene, coumarin, oxadiazole, bisbenzoxazorine, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, pyrane, quinacridone, rubrene, derivatives thereof, a 1-aryl-2,5-di(2-thienyl)pyrrole derivative, a distyrylbenzene derivative, a styrylarylene derivative, a styrylamine derivative, or compounds or polymers having groups composed of these luminescent materials in part of the molecules, or the like is used. Furthermore, for example, light emitting materials such as an iridium complex, an osmium complex, a platinum complex, or a europium complex, or phosphorescence emitting materials such as compounds or polymers having these materials within the molecules can also be used. These materials can be selected and used as appropriate according to need.

In addition, as the material of the conductor layer 5, for example, aluminum or the like is used. Furthermore, the conductor layer 5 may be made to have a lamination structure by combining aluminum and another material. Examples of such a combination include a laminate of an alkali metal and aluminum, a laminate of an alkali metal and silver, a laminate of aluminum and a halide of an alkali metal, a laminate of aluminum and an oxide of an alkali metal, a laminate of aluminum and an alkaline earth metal or a rare earth metal, or alloys of these metal species and other metals. Specific examples thereof include a laminate of aluminum and sodium, an alloy of sodium and potassium, lithium, magnesium, or the like; a laminate of a mixture of aluminum and a mixture of magnesium and silver, a mixture of magnesium and indium, an alloy of aluminum and lithium, or lithium fluoride; or a laminate of aluminum and a mixture of aluminum oxide ($Al_2O_3$).

Figure 2:
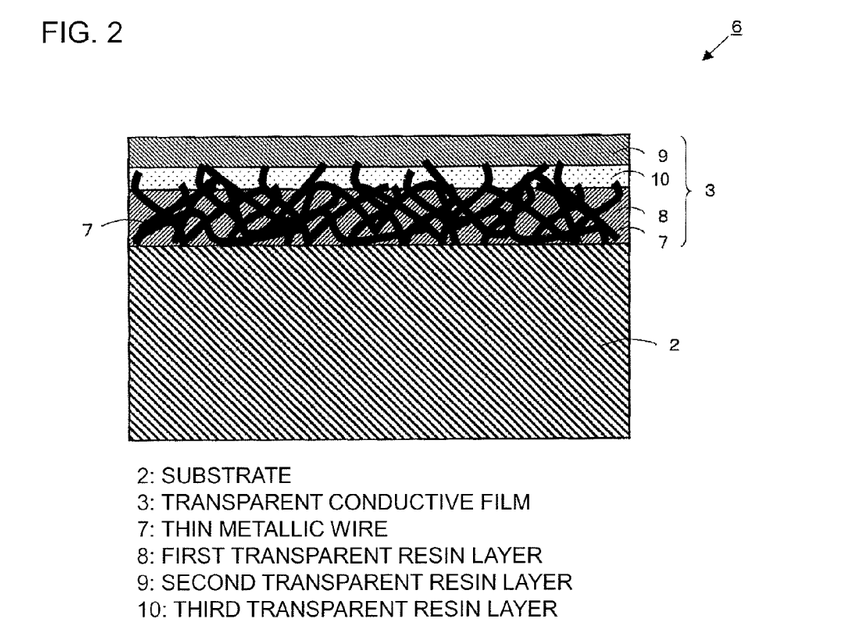
FIG. 2 is a cross-sectional view of the substrate with the transparent conductive film.

Next, the transparent conductive film-attached substrate 6 will be described in detail with reference to FIG. 2. The transparent conductive film-attached substrate 6 includes the substrate 2 and the transparent conductive film 3 formed on the substrate 2. The transparent conductive film 3 includes a first transparent resin layer 8 including a plurality of thin metallic wires 7, a second transparent resin layer 9 containing a conductive polymer, and a third transparent resin layer 10 provided between the first transparent resin layer 8 and the second transparent resin layer 9. The first transparent resin layer 8, the third transparent resin layer 10, and the second transparent resin layer 9 are laminated on the substrate 2 in order. The third transparent resin layer 10 contains a resin which is insoluble in water or has water resistance, and at least one of the first transparent resin layer 8 and the second transparent resin layer 9 contains a resin which is soluble in water. The first transparent resin layer 8, the third transparent resin layer 10, and the second transparent resin layer 9 are applied onto the substrate 2 in order.

The plurality of thin metallic wires 7 are adhered on the substrate 2 by the first transparent resin layer 8. In this state, part of the plurality of thin metallic wires 7 protrudes from a surface of the first transparent resin layer 8 which surface is opposite to a surface facing the substrate 2, and thus the surface of the first transparent resin layer 8 is rugged.

The plurality of thin metallic wires 7 included in the first transparent resin layer 8 are in contact with or close to each other to constitute a three-dimensional network. In addition, part of the thin metallic wires 7 which protrude from the first transparent resin layer 8 extends through the third transparent resin layer 10 to reach the second transparent resin layer 9. These protruding thin metallic wires 7 electrically connect the second transparent resin layer 9 and the first transparent resin layer 8, and thus increased electrical conductivity of the entire transparent conductive film 3 is kept In the present embodiment, the second transparent resin layer 9 contains a resin which is soluble in water. When the second transparent resin layer 9 is applied, the second transparent resin layer 9 is applied onto the third transparent resin layer 10 formed on the first transparent resin layer 8, with water used as a main solvent. In this case, since the third transparent resin layer 10, which contains the resin which is insoluble in water or has water resistance, is interposed between the first transparent resin layer 8 and the second transparent resin layer 9, entry of the second transparent resin layer 9 into the first transparent resin layer 8 can be suppressed.

In addition, in the present embodiment, only the part of the thin metallic wires 7 which protrude from the surface of the first transparent resin layer 8 protrudes from a surface of the third transparent resin layer 10 which surface is opposite to a surface facing the first transparent resin layer 8, and thus the surface of the third transparent resin layer 10 is smoothed. Therefore, when the second transparent resin layer 9 is applied, the second transparent resin layer 9 can be uniformly applied onto the third transparent resin layer 10.

Each thin metallic wire 7 is composed of a fibrous metal having a line width of not less than several nm and not greater than several tens μM, a metal, or metal fine particles. The length of each thin metallic wire 7 is sufficiently longer than the diameter of its cross section perpendicular to the longitudinal direction of the thin metallic wire 7. The amount of the plurality of thin metallic wires 7 included in the transparent conductive film 3 is preferably not less than 0.1 mg/m$^2$ and not greater than 1000 mg/m$^2$, and more preferably not less than 1 mg/m$^2$ and not greater than 100 mg/m$^2$. In view of the translucency of the transparent conductive film 3, the length of each of the plurality of thin metallic wires 7 is preferably not greater than 300 nm, and the average diameter of the plurality of thin metallic wires 7 is preferably not less than 0.3 nm and not greater than 200 nm. In addition, similarly, the average aspect ratio of the plurality of thin metallic wires 7 is preferably not less than 10 and not greater than 10000. Furthermore, in view of the electrical conductivity of the transparent conductive film 3, the thickness of the first transparent resin layer 8 is preferably not less than the average diameter of the plurality of thin metallic wires 7 and not greater than 500 nm.

As the material of each thin metallic wire 7, a fibrous carbon material, a fibrous metallic material, a fibrous metal oxide material, a fibrous composite material, or the like is used. As the fibrous carbon material, for example, a carbon nanotube, a carbon nanofiber, a carbon nanowire, or the like is used. As the fibrous metallic material, for example, a metallic nanowire, a metallic nanotube, a metallic nanorod, or the like is used. As the fibrous metal oxide material, for example, a metal oxide nanowire, a metal oxide nanotube, a metal oxide nanorod, or the like is used. As the fibrous composite material, for example, an organic material fiber whose surface is coated with a metal or a metal oxide, or the like is used.

Among the above materials for each thin metallic wire 7, the metallic nanowire or the carbon nanotube is particularly preferably used. By so doing, the electrical conductivity of the transparent conductive film 3 can be improved, and the resistance of the transparent conductive film 3 can be reduced. In addition, the light transmittance of the transparent conductive film 3 can be improved.

The metallic nanowire is formed in the form of a thin wire and contains a metallic element. In view of the electrical conductivity of the transparent conductive film 3, the length of the metallic nanowire is preferably not less than 3 μm, more preferably not less than 3 μm and not greater than 500 μm, and further preferably not less than 3 μm and not greater than 300 μm. In addition, the average diameter of the metallic nanowires is preferably not greater than 300 nm in view of the translucency of the transparent conductive film 3, and is preferably not less than 10 nm in view of the electrical conductivity. Moreover, in view of both the translucency and the electrical conductivity, the average diameter of the thin metallic wires 7 is preferably not less than 30 nm and not greater than 200 nm.

Examples of the metal contained in the metallic nanowire include silver, copper, gold, aluminum, rhodium, iridium, cobalt, zinc, nickel, indium, iron, palladium, platinum, tin, or titanium, or alloys thereof. In order to improve the electrical conductivity of the transparent conductive film 3, silver, copper, gold, aluminum, or cobalt is preferably used. The method of manufacturing the metallic nanowire is not particularly limited, and a known method such as a liquid phase method or a gas phase method is used.

A carbon nanotube is a fibrous carbon material having a three-dimensional structure in which a graphene sheet in which carbon atoms are arranged in a hexagonal net pattern is wound into a tube shape. Carbon nanotubes are classified into single-layer nanotubes (SWCNT: single-walled nanotubes) composed of a single tube and multi-layer nanotubes (MWCNT: multi-walled nanotubes) in which a plurality of tubes are laminated. In addition, on the basis of difference in the structure of graphene sheet, carbon nanotubes are classified into chiral type carbon nanotubes, zigzag type carbon nanotubes, and armchair type carbon nanotubes.

As the carbon nanotube, a single-walled nanotube having excellent electrical conductivity is preferably used, and an armchair type carbon nanotube having metallic nature is more preferably used. The method of manufacturing the carbon nanotube is not particularly limited, and a known method such as catalyst hydrogen reduction of carbon dioxide, an arc discharge method, a laser vaporization method, a chemical vapor deposition (CVD) method, or a HiPco method is used.

In view of the electrical conductivity of the transparent conductive film 3, the aspect ratio of the carbon nanotube is preferably not less than 102 and more preferably not less than 103. In addition, the average length of the carbon nanotubes is preferably not less than 3 μm, more preferably not less than 3 μm and not greater than 500 μm, and further preferably not less than 3 μm and not greater than 300 μm. In addition, the average diameter of the carbon nanotubes is preferably not less than 100 nm, more preferably not less than 0.1 nm and not greater than 50 nm, and further preferably not less than 1 nm and not greater than 30 nm.

The material of the first transparent resin layer 8 is not particularly limited, and, for example, silicon resin, fluorine resin, acrylic resin, polyethylene, polypropylene, polyethylene terephthalate, polymethyl methacrylate, polystyrene, polyether sulphone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, chlorinated polyethylene, chlorinated polypropylene, other thermoplastic resin, or the like is used. In addition, a copolymer of two or more of the monomers constituting these resins may be used.

In addition, in order to improve the electrical conductivity and the light extraction efficiency of the first transparent resin layer 8, nanoparticles may be added to the first transparent resin layer 8. As the nanoparticles, for example, fine particles of copper, silver, indium tin oxide (ITO), indium zinc oxide (IZO), tin oxide, gold, carbon, titanium oxide, zirconium oxide, silicon dioxide, aluminum oxide, or the like are used. In addition, the shapes of these nanoparticles are not particularly limited, and, for example, these nanoparticles may be formed in spherical shapes.

The method of applying the first transparent resin layer 8 is not particularly limited, and a known method such as spin coating, screen printing, dip coating, die coating, casting, spray coating, or gravure coating is used. In addition, in order to smooth the surfaces of the first transparent resin layer 8 and stabilize the resistance values of these surfaces, the surfaces of the first transparent resin layer 8 may be pressed, for example, using a cylindrical roller.

As the conductive polymer contained in the second transparent resin layer 9, polythiophene, polyaniline, polypyrrole, polyphenylene, polyphenylenevinylene, polyacetylene, polycarbazole, polyacetylene, or the like is used. In addition, they may be used solely and may be used in combination. Moreover, in order to increase the electrical conductivity, doping may be performed using a dopant. The dopant is not particularly limited, and, for example, sulphonic acid, Lewis acid, proton acid, an alkali metal, an alkaline earth metal, or the like is used.

The material of the second transparent resin layer 9 is not particularly limited, and, for example, silicon resin, fluorine resin, acrylic resin, polyethylene, polypropylene, polyethylene terephthalate, polymethyl methacrylate, polystyrene, polyether sulphone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, chlorinated polyethylene, chlorinated polypropylene, other thermoplastic resin, or the like is used. In addition, a copolymer of two or more of the monomers constituting these resins may be used.

In addition, in order to improve the electrical conductivity and the light extraction efficiency of the second transparent resin layer 9, nanoparticles may be added to the second transparent resin layer 9 similarly to the first transparent resin layer 8.

The method of applying the second transparent resin layer 9 is the same as that for the first transparent resin layer 8. In addition, similarly to the first transparent resin layer 8, the surfaces of the second transparent resin layer 9 may be pressed, for example, using a cylindrical roller.

The third transparent resin layer 10 is formed as a porous layer and has a plurality of pores. In the case where the pore diameter of the third transparent resin layer 10 is smaller than 0.5 nm, the thin metallic wires 7 cannot be caused to extend therethrough to the second transparent resin layer 9. Thus, the electrical conductivity of the transparent conductive film 3 cannot be ensured. In addition, in the case where the pore diameter of the third transparent resin layer 10 is larger than 1 μm, the second transparent resin layer 9, which contains the resin which is soluble in water, enters the first transparent resin layer 8, and it is difficult to suppress mixing of the first transparent resin layer 8 and the second transparent resin layer 9. Therefore, the pore diameter of the third transparent resin layer 10 is preferably not less than 0.5 nm and not greater than 1 μm. Thus, mixing of the first transparent resin layer 8 and the second transparent resin layer 9 can reliably be suppressed, and the electrical conductivity of the transparent conductive film 3 can be ensured.

In addition, in the case where the thickness of the third transparent resin layer 10 is smaller than 5 nm, it is difficult to suppress mixing of the first transparent resin layer 8 and the second transparent resin layer 9. Moreover, in the case where the thickness of the third transparent resin layer 10 is larger than 1 μm, the thin metallic wires 7 cannot be caused to protrude from the surface of the third transparent resin layer 10, and thus the electrical conductivity of the transparent conductive film 3 is not kept. Therefore, the thickness of the third transparent resin layer 10 is preferably not less than 5 nm and not greater than 1 μm. Thus, the electrical conductivity of the transparent conductive film 3 can be ensured, and mixing of the first transparent resin layer 8 and the second transparent resin layer 9 can reliably be suppressed.

In addition, the contact angle with respect to water on the surface of the third transparent resin layer 10 is preferably not greater than 75°. Thus, since coating agents that are the materials for forming the first transparent resin layer 8 and the second transparent resin layer 9 contain water as a main solvent in many cases, the third transparent resin layer 10 has increased wettability to such coating agents and is excellent in uniform application properties.

The material of the third transparent resin layer 10 is not particularly limited as long as a porous layer can be formed therefrom, and silicone resin, fluorine resin, acrylic resin, polyethylene, polypropylene, polyethylene terephthalate, polymethyl methacrylate, polystyrene, polyether sulphone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, chlorinated polyethylene, chlorinated polypropylene, other thermoplastic resin, or the like is used. In addition, a copolymer of two or more of the monomers constituting these resins may be used.

As the material of the third transparent resin layer 10, a binder composed of a silicone resin is particularly preferably used. By so doing, the third transparent resin layer 10 has increased wettability to the coating agents for forming the first transparent resin layer 8 and the second transparent resin layer 9 and is excellent in uniform application properties.

As such a silicone resin, tetraalkoxysilanes such as tetramethoxysilane, tetraethoxysilane, tetra-n-propoxysilane, tetra-1-propoxysilane, and tetra-n-butoxysilane, trialkoxysilanes such as methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, ureidopropyltrimethoxysilane, and 3-ureidopropyltriethoxysilane, or dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, di-1-propyldimethoxysilane, di-1-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-yclohexyldimethoxysilane, di-n-cyclohexyldiethoxysilane, diphenyldimethoxysilane, and diphenyldiethoxysilane, are used. These alkoxysilanes can be used solely, or two or more of them can be mixed and used. In addition to the polyfunctional alkoxysilane, a monofunctional alkoxysilane can also be used in combination. As the monofunctional alkoxysilane, for example, trimethylmethoxysilane, trimethylethoxysilane, triethylmethoxysilane, triethylethoxysilane, or the like is used. Moreover, methyl silicate, ethyl silicate, or the like, which are condensates of them, is also used.

In addition, in order to improve the electrical conductivity and the light extraction efficiency of the third transparent resin layer 10, nanoparticles may be added to the third transparent resin layer 10 similarly to the first transparent resin layer 8 and the second transparent resin layer 9.

The method of applying the third transparent resin layer 10 is the same as those for the first transparent resin layer 8 and the second transparent resin layer 9. In addition, similarly to the first transparent resin layer 8 and the second transparent resin layer 9, the surfaces of the third transparent resin layer 9 (SIC: correctly it should be 10) may be pressed, for example, using a cylindrical roller.

According to the transparent conductive film-attached substrate 6 of the present embodiment, since the third transparent resin layer 10, which contains the resin which is insoluble in water or has water resistance, is provided between the first transparent resin layer 8 and the second transparent resin layer 9, mixing of the second transparent resin layer 9 with the first transparent resin layer 8 can be suppressed. In addition, since the second transparent resin layer 9 is formed on the third transparent resin layer 10, the second transparent resin layer 9 can be less likely to be damaged by the first transparent resin layer 8, as compared to the case where the second transparent resin layer 9 is formed directly on the first transparent resin layer 8. Moreover, since the third transparent resin layer 10 is smoother than the first transparent resin layer 8 including the thin metallic wires 7, the second transparent resin layer 9 can be uniformly applied onto the third transparent resin layer 10. As a result, the electrical conductivity of the transparent conductive film 3 can be made uniform. When the transparent conductive film-attached substrate 6 described above is used as a substrate of an organic EL element, light can be emitted with uniform brightness, and a highly-reliable surface emitting device can be provided.

Next, Examples 1 to 10 and Comparative Examples 1 to 6 will be described.

Prior to producing samples of the following Examples 1 to 10 and Comparative Examples 1 to 6, thin metallic wires, the material of a first transparent resin layer, the material of a first porous layer, the material of a second porous layer, the material of a third porous layer, and the material of a second transparent resin layer were produced. Hereinafter, they will be described in order.

(Thin Metallic Wires)

As the thin metallic wires, silver nanowires were produced according to a publicly known paper, "Preparation of Ag nanorods with high yield by polyol process," Materials Chemistry and Physics vol. 114 p 333-338. In this case, the average diameter of the silver nanowires was set to 50 nm, and the average length of the silver nanowires was set to 5 μm.

(Material of First Transparent Resin Layer)

3 parts by mass of the above silver nanowires and 1 parts by mass of cellulose resin were mixed with water as a dispersion medium. By so doing, the material, of the first transparent resin layer, having a solid content of 4.0% and including the thin metallic wires was produced.

(Material of First Porous Layer)

9.8 parts by mass of silicone resin MS51 (51% in oxide conversion) manufactured by Mitsubishi Chemical Corporation was dissolved in 85.2 parts by mass of isopropyl alcohol (hereinafter, referred to as IPA). Next, 5 parts by mass of 0.1 H nitric acid was added and well mixed with the mixture liquid of the silicone resin and the IPA, and then mixed by stirring for 1 hour in a constant temperature atmosphere of 25° C. By so doing, the material, of the first porous layer, having a solid content of 5% was produced.

(Material of Second Porous Layer)

5.88 parts by mass of silicone resin MS51 (51% in oxide conversion) manufactured by Mitsubishi Chemical Corporation was dissolved in 82.54 parts by mass of IPA. Next, 6.67 parts by mass of ITO nanoparticles (an IPA dispersion liquid having a solid content of 30%, manufactured by C. I. Kasei Company, Limited) was added to the mixture liquid of the silicone resin and the IPA. Furthermore, 5 parts by mass of 0.1 H nitric acid was added and well mixed with the mixture liquid of the silicone resin and the IPA to which mixture liquid the ITO nanoparticles had been added, and then mixed by stirring for 1 hour in a constant temperature atmosphere of 25° C. By so doing, the material, of the second porous layer, having a solid content of 5% was produced.

(Material of Third Porous Layer)

9.8 parts by mass of silicone resin MS51 (51% in oxide conversion) manufactured by Mitsubishi Chemical Corporation was dissolved in 85.2 parts by mass of IPA. Next, 5 parts by mass of 0.1 H ammonia was added and well mixed with the mixture liquid of the silicone resin and the IPA, and then mixed by stirring for 1 hour in a constant temperature atmosphere of 25° C. By so doing, the material, of the third porous layer, having a solid content of 5% was produced.

(Material of Second Transparent Resin Layer)

1 parts by mass of poly(3,4-ethylenedioxythiophene) and 2.5 parts by mass of polyanion poly(styrenesulfonate) were mixed with water as a dispersion medium. By so doing, the material, of the second transparent resin layer, having a solid content of 3.5% and containing a conductive polymer, was produced.

Next, the samples of Examples 1 to 10 and Comparative Examples 1 to 6 were produced.

Example 1

As a substrate, alkali-free glass No. 1737 manufactured by Corning Incorporated (the refractive index of light having a wavelength of 500 nm is 1.50 to 1.53) was prepared. Next, the previously-produced material of the first transparent resin layer which material includes the thin metallic wires was applied onto the substrate by a spin coating method such that the thickness was 100 nm, and was heated for 5 minutes at 100° C. By so doing, the first transparent resin layer was formed on the substrate. Next, the material of the first porous layer was applied onto the first transparent resin layer such that the thickness was 30 nm, and was heated for 5 minutes at 100° C. By so doing, a porous layer having a contact angle of 30 degrees with respect to water was formed on the first transparent resin layer. Next, the material of the second transparent resin layer was applied onto the porous layer such that the thickness was 100 nm, and was heated for 5 minutes at 100° C. By so doing, the second transparent resin layer was formed on the porous layer. In this manner, the sample of Example 1 was produced.

Example 2

The sample of Example 2 was produced in the same manner as Example 1 described above, except that instead of the material of the first porous layer, the material of the second porous layer was used to form a second porous layer having a pore diameter of 10 nm and a contact angle of 60 degrees with respect to water.

Example 3

The sample of Example 3 was produced in the same manner as Example 1 described above, except that the material of the first porous layer was applied onto the substrate such that the thickness was 300 nm.

Example 4

The sample of Example 4 was produced in the same manner as Example 1 described above, except that instead of the material of the first porous layer, the material of the third porous layer was used to form a third porous layer having a pore diameter of 300 nm and a contact angle of 30 degrees with respect to water.

Example 5

In the same manner as Example 1, a first transparent resin layer, a first porous layer, and a second transparent resin layer were formed on a release film in order. Next, a laminate composed of the release film, the first transparent resin layer, the first porous layer, and the second transparent resin layer was transferred onto a glass substrate. In this manner, the sample of Example 5 was produced.

Example 6

Vacuum deposition of N,N-diphenyl-N,N-bis-3-methyl-phenyl-1,1-diphenyl-4,4-diamine manufactured by Dojindo Laboratories was conducted on the sample of Example 1. By so doing, a hole transport layer was formed on the sample of Example 1. In this case, the thickness of the hole transport layer was set to 50 nm. Next, vacuum deposition of an aluminum quinolinol complex (tris(8-hydroquinoline)aluminum) manufactured by Dojindo Laboratories was conducted on the hole transport layer. By so doing, an organic light emitting layer was formed on the hole transport layer. In this case, the thickness of the organic light emitting layer was set to 50 nm. Next, vacuum deposition of aluminum was conducted on the organic light emitting layer. By so doing, a conductor layer composed of aluminum was formed on the organic light emitting layer. In this manner, an organic EL element having the sample of Example 1 as an anode was produced.

Example 7

The sample of Example 7 was produced in the same manner as Example 6 described above, except that the sample of Example 2 was used as the anode of the organic EL element.

Example 8

The sample of Example 8 was produced in the same manner as Example 6 described above, except that the sample of Example 3 was used as the anode of the organic EL element.

Example 9

The sample of Example 9 was produced in the same manner as Example 6 described above, except that the sample of Example 4 was used as the anode of the organic EL element.

Example 10

The sample of Example 10 was produced in the same manner as Example 6 described above, except that the sample of Example 5 was used as the anode of the organic EL element.

Comparative Example 1

The sample of Comparative Example 1 was produced in the same manner as Example 1 described above, except that the first porous layer and the second transparent resin layer were not formed.

Comparative Example 2

The sample of Comparative Example 2 was produced in the same manner as Example 1 described above, except that the first porous layer was not formed.

Comparative Example 3

The sample of Comparative Example 3 was produced in the same manner as Example 1 described above, except that instead of the first porous layer, silicon dioxide ($SiO_2$) having a pore diameter of 0.1 mm was formed by a sputtering method.

Comparative Example 4

The sample of Comparative Example 4 was produced in the same manner as Example 6 described above, except that the sample of Comparative Example 1 was used as the anode of the organic EL element.

Comparative Example 5

The sample of Comparative Example 5 was produced in the same manner as Example 6 described above, except that the sample of Comparative Example 2 was used as the anode of the organic EL element.

Comparative Example 6

The sample of Comparative Example 6 was produced in the same manner as Example 6 described above, except that the sample of Comparative Example 3 was used as the anode of the organic EL element.

For the samples of Examples 1 to 5 and Comparative Examples 1 to 3 described above, a test of measuring surface resistance, a test of measuring surface roughness Ra, and a test of evaluating application properties were conducted. In addition, for Examples 6 to 10 and Comparative Examples 4 to 6 described above, a test of evaluating operation of the organic EL element was conducted. Hereinafter, the test of measuring surface resistance, the test of measuring surface roughness Ra, the test of evaluating application properties, and the test of evaluating operation of the organic EL element will be described in order.

(Measurement of Surface Resistance)

A surface resistance value of each sample was measured using LORESTA EP MCP-T360 manufactured by Mitsubishi Chemical Corporation.

(Measurement of Surface Roughness)

A surface roughness of each sample was measured using Nanosearch Microscope SFT-3500 manufactured by Shimadzu Corporation, where the measurement view was 30 μm long and 30 μm wide.

(Evaluation of Application Properties)

A state of a surface of the transparent conductive film of each sample was visually observed.

(Evaluation of Operation of Organic EL Element)

An inverse voltage (in a direction opposite to that of a current flown when light is caused to be emitted) of 5 [V] was applied to the organic EL element to check whether or not the organic EL lights up.

Table 1 shows the results of the above tests conducted for Examples 1 to 10 and Comparative Examples 1 to 6. It is noted that in Table 1, "o" indicates that application was favorably conducted on the surface of the sample, and "x" indicates that application was unfavorably conducted on the surface of the sample.

TABLE 1

| | Surface resistance Ω/□ | Surface roughness [nm] | Application properties | Operation of organic EL element |
|---|---|---|---|---|
| Example 1 | 10 | 5 | o | — |
| Example 2 | 8 | 6 | o | — |
| Example 3 | 15 | 3 | o | — |
| Example 4 | 12 | 8 | o | — |
| Example 5 | 10 | 2 | o | — |
| Example 6 | — | — | — | Lighting |
| Example 7 | — | — | — | Lighting |
| Example 8 | — | — | — | Lighting |
| Example 9 | — | — | — | Lighting |
| Example 10 | — | — | — | Lighting |
| Comparative Example 1 | 10 | 15 | o | — |
| Comparative Example 2 | Unstable | 10 | x Repellent | — |
| Comparative Example 3 | 500 | 5 | o | — |
| Comparative Example 4 | — | — | — | Not lighting |
| Comparative Example 5 | — | — | — | Not lighting |
| Comparative Example 6 | — | — | — | Not lighting |

As shown in Table 1, in measurement of surface resistance, the surface resistance values were 8 to 15Ω/□, in Examples 1 to 5. On the other hand, in Comparative Example 3, the surface resistance value was 500Ω/□, which is very high, and in Comparative Example 2, the surface resistance value was unstable. In measurement of surface roughness Ra, the surface roughnesses Ra were 2 to 8 nm in Examples 1 to 5. On the other hand, the surface roughness Ra was 15 nm in Comparative Example 1, and the surface roughness Ra was 10 nm in Example 2 (SIC: correctly it should be Comparative Example 2). In evaluation of application properties, the application properties were favorable in each of Examples 1 to 5. On the other hand, in Comparative Example 2, the application properties were not favorable, and repellency occurred. In evaluation of operation of the organic EL element, the organic EL element lit up in each of Examples 6 to 10. On the other hand, the organic EL element did not light up in each of Comparative Examples 4 to 6.

These results indicate that the transparent conductive film-attached substrate in which the third transparent resin layer is provided between the first transparent resin layer and the second transparent resin layer has a decreased surface resistance value and a decreased surface roughness, and application properties thereof are also favorable. In addition, these results also indicate that an organic EL element including such a transparent conductive film-attached substrate is a highly-reliable device.

The present invention is not limited to the configuration of the above embodiment, and various modifications can be made without changing the gist of the present invention. For example, the second transparent resin layer 9 and the third transparent resin layer 10 may be laminated on the substrate 2 in order, and the first transparent resin layer 8 may contain a resin which is soluble in water. In other words, in the case where a transparent resin layer which is an upper layer which is soluble in water is formed by application, it suffices that in order that the transparent resin layer is not mixed with a transparent resin layer which is a lower layer, a transparent resin layer containing a resin which is insoluble in water or has water resistance is provided between these layers. In addition, the transparent conductive film 3 can be used as a transparent electrode of a liquid crystal display, a plasma display, an organic solar cell, or the like.

The present application is based on Japanese Patent Application No. 2011-053424, the disclosure of which is incorporated herein by reference.

DESCRIPTION OF THE REFERENCE CHARACTERS

1 organic electroluminescence element
2 substrate
6 transparent conductive film-attached substrate
7 thin metallic wire (metallic nanowire or carbon nanotube)
8 first transparent resin layer
9 second transparent resin layer
10 third transparent resin layer

The invention claimed is:

1. A transparent conductive film comprising:
   a first transparent resin layer comprising metallic nanowires or carbon nanotubes;
   a second transparent resin layer comprising a conductive polymer; and
   a third transparent resin layer provided between the first transparent resin layer and the second transparent resin layer, wherein
   at least one of the first transparent resin layer and the second transparent resin layer comprises a resin which is soluble in water, and
   the third transparent resin layer comprises a resin which is insoluble in water or has water resistance and is formed as a porous layer with pores having a diameter not less than 0.5 nm and not greater than 1 μm.

2. The transparent conductive film according to claim 1, wherein a thickness of the third transparent resin layer is not less than 5 nm and not greater than 1 μm.

3. The transparent conductive film according to claim 1, wherein a contact angle with respect to water on a surface of the third transparent resin layer is not greater than 75°.

4. The transparent conductive film according to claim 1, wherein the third transparent resin layer comprises a binder composed of a silicone resin.

5. A transparent conductive film-attached substrate in which the transparent conductive film according to claim 1 is formed on a substrate.

6. An organic electroluminescence element comprising the transparent conductive film-attached substrate according to claim 5.

7. The transparent conductive film according to claim 1, wherein part of the metallic nanowires or part of the carbon nanotubes protrude from a surface of the first transparent resin layer, extend through the third transparent layer, and protrude from a surface of the third transparent layer opposite to a surface of that layer facing the first transparent resin layer.

* * * * *